United States Patent
Zhao et al.

(10) Patent No.: US 9,299,558 B2
(45) Date of Patent: Mar. 29, 2016

(54) RUN-TO-RUN STABILITY OF FILM DEPOSITION

(71) Applicant: Applied Materials, Inc., Santa Clara, CA (US)

(72) Inventors: Lai Zhao, Campbell, CA (US); Gaku Furuta, Sunnyvale, CA (US); Qunhua Wang, Santa Clara, CA (US); Soo Young Choi, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 119 days.

(21) Appl. No.: 14/221,421

(22) Filed: Mar. 21, 2014

(65) Prior Publication Data

US 2015/0270107 A1    Sep. 24, 2015

(51) Int. Cl.
*H01L 21/44*    (2006.01)
*H01L 21/02*    (2006.01)
*H01J 37/32*    (2006.01)

(52) U.S. Cl.
CPC ..... *H01L 21/02211* (2013.01); *H01J 37/32853* (2013.01); *H01J 37/32862* (2013.01); *H01L 21/02164* (2013.01); *H01L 21/02274* (2013.01)

(58) Field of Classification Search
CPC ............. H01L 21/28556; H01L 21/76843
USPC .................................................. 438/680, 789
See application file for complete search history.

(56) References Cited

U.S. PATENT DOCUMENTS

| 5,589,233 | A | 12/1996 | Law et al. |
| 5,812,403 | A * | 9/1998 | Fong ............... B08B 7/0035 134/1.1 |
| 6,121,161 | A | 9/2000 | Rossman et al. |
| 6,449,521 | B1 * | 9/2002 | Gupta .............. B08B 7/0035 118/715 |
| 6,803,325 | B2 * | 10/2004 | M'Saad ............ C23C 16/401 118/697 |
| 7,109,114 | B2 * | 9/2006 | Chen ................ C23C 16/4404 257/E21.279 |
| 7,790,634 | B2 * | 9/2010 | Munro ............. C23C 16/401 257/E21.478 |
| 7,879,409 | B2 | 2/2011 | Furuta et al. |
| 2006/0093756 | A1 | 5/2006 | Rajagopalan et al. |
| 2006/0189171 | A1 | 8/2006 | Chua et al. |
| 2008/0050932 | A1 * | 2/2008 | Lakshmanan ..... C23C 16/0245 438/786 |

* cited by examiner

*Primary Examiner* — Jami M Valentine
(74) *Attorney, Agent, or Firm* — Patterson & Sheridan, LLP

(57) ABSTRACT

A method of depositing a film that includes heterogeneously seasoning a processing chamber is provided. After a processing chamber is cleaned, a heterogeneous seasoning deposition is performed to stabilize the deposition rate drift before a substrate may be positioned therein. A film, such as a $SiO_x$ film, may then be deposited on the substrate. The substrate may then be removed from the processing chamber and replaced with a second substrate. A film may then be deposited on the second substrate. The substrate positioning, deposition, and substrate removal cycle may be repeated until the cleaning cycle is complete. The processing chamber may be cleaned a second time, and another series of substrates may be similarly processed.

17 Claims, 2 Drawing Sheets

RUN-TO-RUN STABILITY OF FILM DEPOSITION

BACKGROUND

1. Field

Aspects of the present disclosure generally relate to the fabrication of devices, and more specifically to methods of depositing films used in devices.

2. Description of the Related Art

Silicon oxide ($SiO_x$) films are commercially significant in numerous applications, such as in thin film transistors (TFTs) and active matrix organic light emitting diode (AMOLED) displays. $SiO_x$ films, such as $SiO_x$ films formed from tetraethyl orthosilicate (TEOS), perform better in those applications when the thicknesses of the deposited $SiO_x$ films are precisely controlled.

Conventional deposition processes are performed within "cleaning cycles." Before a film is deposited on a substrate, the processing chamber is cleaned. After cleaning is complete, a series of substrates enter the processing chamber and films are deposited thereon. For example, the substrates may enter the processing chamber one at a time. As the series of substrates undergo deposition processes, unwanted material builds up on processing chamber surfaces. The unwanted material may affect further processing, such as by causing particle contamination. Particle contamination may cause device failure. After a certain number of substrates are processed, the chamber is cleaned again in order to remove the unwanted material. The time period between cleanings, often measured in the number of substrates processed, is referred to as the cleaning cycle. For example, a cleaning cycle may include the processing of six to eight substrates.

In conventional $SiO_x$ processing, the rate of $SiO_x$ deposition increases (i.e., the rate drifts) within each cleaning cycle. The rate drift undermines the device performance that can be obtained from precisely controlling the thicknesses of the $SiO_x$ films. Efforts have been taken to reduce the rate drift (i.e., to stabilize the deposition rate). However such efforts have been unsatisfactory to device manufacturers.

Therefore, what is need in the art is an improved technique for reducing rate drift in film deposition process, such as $SiO_x$ deposition processes.

SUMMARY

A method of depositing a film that includes heterogeneously seasoning a processing chamber is provided. After a processing chamber is cleaned, a substrate may be positioned therein. A film, such as a $SiO_x$ film, may then be deposited on the substrate. The substrate may then be removed from the processing chamber and replaced with a second substrate. A film may then be deposited on the second substrate. The substrate positioning, deposition, and substrate removal cycle may be repeated until the cleaning cycle is complete. The processing chamber may be cleaned a second time, and another series of substrates may be similarly processed.

In one embodiment, a method of depositing a silicon oxide film is provided. The method includes cleaning a processing chamber. The method also includes heterogeneously seasoning the processing chamber with a first material. The method further includes positioning a substrate inside the processing chamber. The method additionally includes depositing a silicon oxide film on the substrate.

In another embodiment, a method of depositing a film is provided. The method includes cleaning a processing chamber. The method also includes heterogeneously seasoning the processing chamber with a first material. The heterogeneously seasoning includes forming a seasoning film on at least one chamber component exposed to deposition precursors. The seasoning film has a thickness of at least 10000 Å. The method additionally includes positioning a substrate in the processing chamber. The method further includes depositing a film on the substrate. The film deposited on the substrate comprises a second material that is different from the first material.

In another embodiment, a method of depositing a silicon oxide film is provided. The method includes cleaning a processing chamber. The method further includes forming a silicon nitride seasoning film on at least one chamber component exposed to deposition precursors. The silicon nitride seasoning film has a thickness of at least about 10000 Å. The process for forming the silicon nitride seasoning film includes flowing silane, ammonia, and nitrogen into the processing chamber, and igniting the silane and ammonia into a plasma. The silane and ammonia are ignited into a plasma from an RF power of between about 1400 watts/$m^2$ and about 2200 watts/$m^2$. The flow rate ratio of silane to ammonia is between about 1:2 and about 1:6. The flow rate ratio of silane to nitrogen is between about 1:5 about 1:15. The process for forming the silicon nitride seasoning film further includes maintaining the processing chamber at a pressure between about 1000 mTorr and about 2000 mTorr. The method of depositing a silicon oxide film further includes positioning a substrate in the processing chamber. The method additionally includes depositing a silicon oxide film on the substrate. The method of depositing the silicon oxide film includes flowing tetraethyl orthosilicate into the processing chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

A method of depositing a film that includes heterogeneously seasoning a processing chamber is provided. After a processing chamber is cleaned, a substrate may be positioned therein. A film, such as a $SiO_x$ film, may then be deposited on the substrate. The substrate may then be removed from the processing chamber and replaced with a second substrate. A film may then be deposited on the second substrate. The substrate positioning, deposition, and substrate removal cycle may be repeated until the cleaning cycle is complete. The processing chamber may be cleaned a second time, and another series of substrates may be similarly processed.

Description below will be made with reference to a plasma enhanced chemical vapor deposition (PECVD) chamber and system sold by AKT America, Inc., located in Santa Clara, Calif., a subsidiary of Applied Materials, Inc. It is to be understood that the embodiments discussed herein may be practiced in other chambers and systems as well, including chambers and systems sold by other manufacturers.

Figure 1:
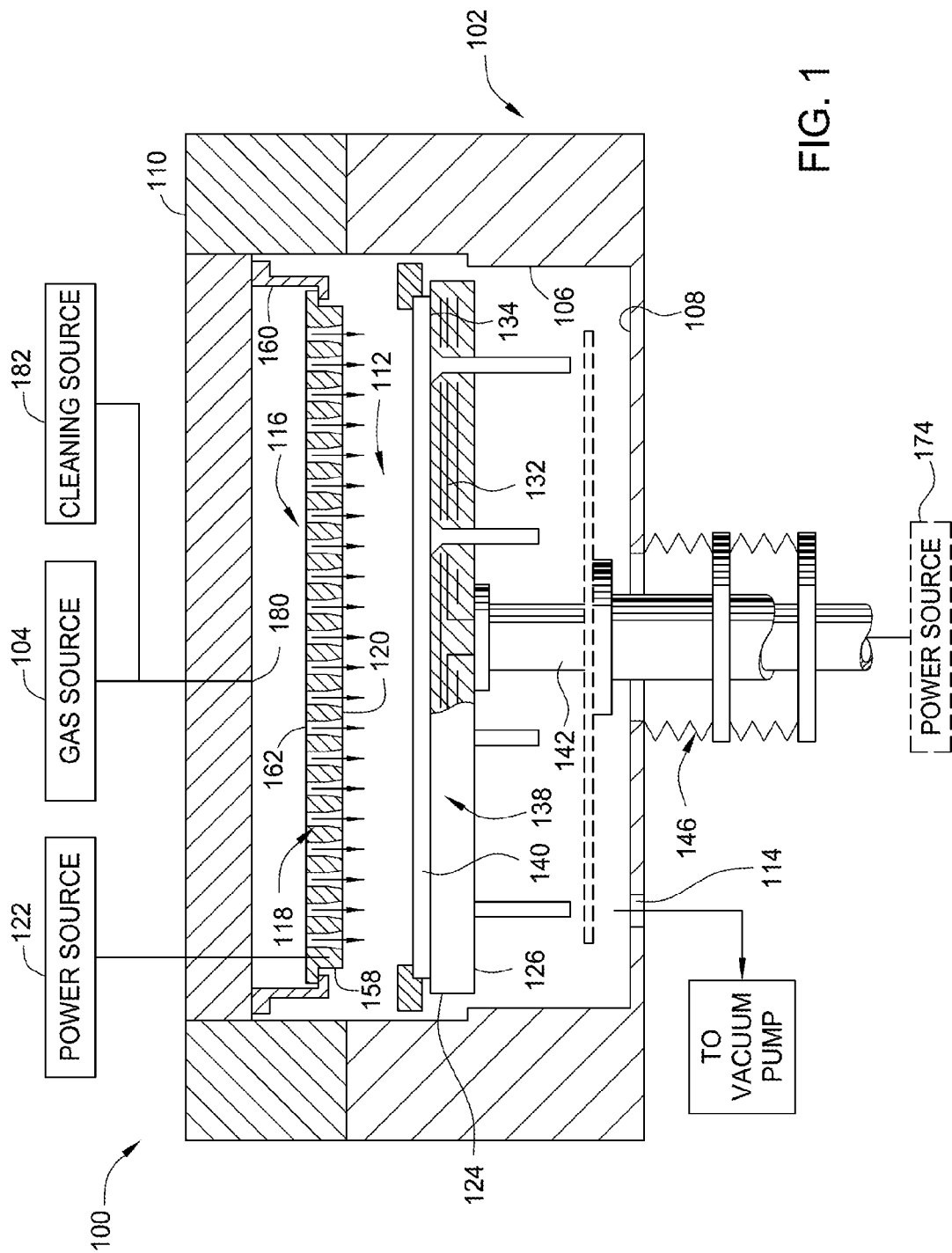
FIG. 1 is a schematic cross-sectional view of one embodiment of a substrate processing system having one or more plasma enhanced chemical vapor deposition chambers suitable for practicing embodiments disclosed herein.

FIG. 1 is a schematic cross-sectional view of one embodiment of a substrate processing apparatus 100. In one embodiment, the apparatus 100 comprises aPECVD chamber. The substrate processing apparatus 100 generally includes one or more processing chambers 102, substrate input/output chambers, a main transfer robot for transferring substrate among the substrate input/output chambers and the processing chambers 102, and a mainframe controller for automatic substrate processing control.

The processing chamber 102 is usually coupled to one or more supply sources 104 for delivery of one or more source compounds and/or precursors. The one or more supply sources 104 may include a tetraethyl orthosilicate supply source, an ammonia supply source, a nitrogen supply source, among others. The processing chamber 102 has walls 106 and a bottom 108 that partially define a process volume 112. The process volume 112 is typically accessed through a port and a valve (not shown) to facilitate movement of a substrate 140, such as a large area glass substrate, into and out of the processing chamber 102. The walls 106 support a lid assembly 110. A pumping port 114 is disposed through one of the lid assembly 110, walls 106 or bottom 108 of the processing chamber 102 to couple the process volume 112 to an exhaust port (that includes various pumping components, not shown) for exhausting any gases and process by-products out of the processing chamber 102.

A temperature controlled substrate support assembly 138 is centrally disposed within the processing chamber 102. The substrate support assembly 138 supports the substrate 140 during processing. The substrate support assembly 138 comprises an aluminum body 124 that encapsulates at least one embedded heater 132. The heater 132, such as a resistive element, disposed in the substrate support assembly 138, is coupled to an optional power source 174 and controllably heats the substrate support assembly 138 and the substrate 140 positioned thereon to a predetermined temperature.

The substrate support assembly 138 generally is grounded such that RF power supplied by a plasma power source 122 to a gas distribution plate assembly 118 positioned between the lid assembly 110 and substrate support assembly 138 (or other electrode positioned within or near the lid assembly of the chamber) may excite gases present in the process volume 112 between the substrate support assembly 138 and the gas distribution plate assembly 118.

Generally, the substrate support assembly 138 has a lower side 126 and an upper side 134, supporting the substrate 140. The lower side 126 has a stem 142 coupled thereto and connected to a lift system (not shown) for moving the support assembly 138 between an elevated processing position (as shown) and a lowered substrate transfer position. The stem 142 additionally provides a conduit for electrical and thermocouple leads between the substrate support assembly 138 and other components of the system 100. A bellows 146 is coupled to the substrate support assembly 138 to provide a vacuum seal between the process volume 112 and the atmosphere outside the processing chamber 102 and facilitate vertical movement of the support assembly 138.

The lid assembly 110 typically includes an entry port 180 through which process gases provided by the supply sources 104 are introduced into the processing chamber 102. The entry port 180 is also coupled to a cleaning source 182. The cleaning source 182 typically provides a cleaning agent, such as nitrogen trifluoride, that is introduced into the processing chamber 102 to remove deposition by-products and films from processing chamber hardware, including the gas distribution plate assembly 118.

The gas distribution plate assembly 118 includes a perforated area 116 through which precursors and other gases, such as nitrogen gas, supplied from the supply sources 104 are delivered to the process volume 112. The perforated area 116 is configured to provide uniform distribution of gases passing through the gas distribution plate assembly 118 into the processing chamber 102. The gas distribution plate assembly 118 typically includes a diffuser plate 158 suspended from a hanger plate 160. A plurality of gas passages 162 are formed through the diffuser plate 158 to allow a predetermined distribution of gas passing through the gas distribution plate assembly 118 and into the process volume 112. The gas distribution plate assembly 118 has a lower surface 120.

Figure 2:
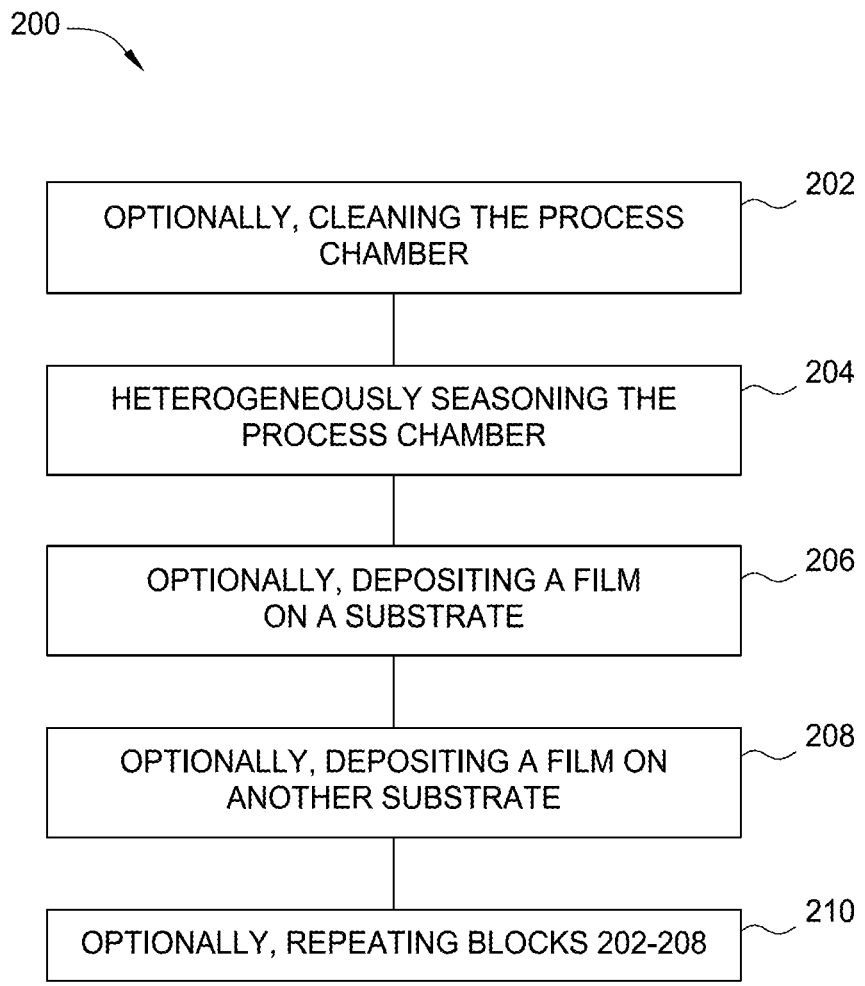
FIG. 2 is a flow diagram illustrating one embodiment of a method for depositing a film.

FIG. 2 is a flow diagram illustrating one embodiment of a method 200 for depositing a film, such as a $SiO_x$ film. In some embodiments, the processing chamber 102 is cleaned. The method includes performing a heterogeneous seasoning process in the processing chamber 102. One aspect of a seasoning process includes forming a "seasoning film" on at least one chamber component exposed to deposition precursors. For example, the seasoning film may be formed on a chamber wall, such as one of the walls 106. One aspect of a heterogeneous seasoning process is that the seasoning film has a different chemical composition than that of the films deposited on the one or more substrates 140 within the cleaning cycle. For example, a representative heterogeneous seasoning process includes forming a silicon nitride seasoning film when a film deposited within the cleaning cycle is a film other than silicon nitride, such as a TEOS $SiO_x$ film. Aspects of the method disclosed herein further include positioning a substrate 140 in the processing chamber 102 and then depositing a film on the substrate 140. In some embodiments disclosed herein, the substrate 140 is removed from the processing chamber 102 and a second substrate 140 is positioned in the processing chamber 102. A film may then be deposited on the second substrate 140. In other embodiments disclosed herein, the substrate positioning, film deposition, and substrate removal cycle is repeated until the cleaning cycle is complete. In other embodiments disclosed herein, the processing chamber 102 may be cleaned a second time, and another series of substrates 140 may be similarly processed.

At optional block 202, the processing chamber 102 is cleaned. The processing chamber 102 may be cleaned by any suitable chamber cleaning process. The cleaning process removes unwanted material from the processing chamber walls 106 and other areas of the processing chamber 102. A representative cleaning process includes a dry cleaning process wherein a gas, such as nitrogen trifluoride ($NF_3$), is used to remove the unwanted material. The cleaning gas may be flowed from the cleaning source 182 to the entry port 180 and then into the processing volume 112. During the cleaning process, the cleaning gases may be ignited into a plasma by the power source 122, and the species generated by the plasma may assist in cleaning the processing chamber 102.

At block 204, a heterogeneous seasoning process is performed within the processing chamber 102. In embodiments where silicon nitride will not be deposited within the cleaning cycle, silicon nitride may be deposited as a seasoning film. In embodiments where silane $SiO_x$ will not be deposited within the cleaning cycle, silane $SiO_x$ may be deposited as a seasoning film.

In embodiments including a silicon nitride seasoning film, the silicon nitride seasoning film may be deposited from silane and ammonia, optionally in the presence of an inert or substantially inert gas. The inert or substantially inert gas may be, for example, nitrogen or argon.

In forming a silicon nitride seasoning film, silane may be flowed from the supply sources 104 to the entry port 180 and then into the process volume 112. Silane may be flowed into the processing chamber 102 at a flow rate per substrate surface area of between about 710 $sccm/m^2$ and about 1400 $sccm/m^2$, such as between about 890 $sccm/m^2$ and about 1250 $sccm/m^2$, such as about 1100 $sccm/m^2$. Ammonia may similarly be flowed into the processing chamber 102 at a flow rate per substrate surface area of between about 3600 $sccm/m^2$ and about 5400 $sccm/m^2$, such as between 3900 $sccm/m^2$ and about 5000 $sccm/m^2$, such as about 4300 $sccm/m^2$. The inert or substantially inert gas may similarly be flowed into the processing chamber 102 at a flow rate per substrate surface area of between about 8900 $sccm/m^2$ and about 13000 $sccm/m^2$, such as between about 9600 $sccm/m^2$ and about 12000 $sccm/m^2$, such as about 11000 $sccm/m^2$. The flow rate ratio of silane to ammonia may be between about 1:2 and about 1:6, such as about 1:4. The flow rate ratio of silane to the inert or substantially inert gas may be between about 1:5 and about 1:15, such as between about 1:9 and about 1:11, such as about 1:10.

While forming the silicon nitride seasoning film, the pressure of the processing chamber 102 may be between about 1000 mTorr and about 2000 mTorr, such as between about 1250 mTorr and about 1750 mTorr, such as about 1500 mTorr. The spacing between the upper side 134 of the substrate support assembly 138 and the lower surface 120 of the gas distribution plate assembly 118 may be between about 800 mil and about 1200 mil, such as between about 900 mil and about 1100 mil, such as about 1000 mil. The substrate support assembly 138 may be heated to a temperature between about 250° C. and about 400° C. Alternatively, the substrate support assembly 138 may not be heated such that the heterogeneous seasoning process is carried out at the ambient temperature of the processing chamber 102.

A plasma may be generated in the processing chamber 102 to assist in forming the seasoning film. The plasma power source 122 may ignite a plasma from the precursor gases by applying to the gas distribution plate assembly 118 an RF power per substrate surface area of between about 1400 $W/m^2$ and about 2200 $W/m^2$, such as between about 1600 $W/m^2$ and about 1900 $W/m^2$, such as about 1800 $W/m^2$.

In other embodiments, the silicon nitride seasoning film may be formed from different precursor gases. For example, in some embodiments, the silicon nitride seasoning film may be formed from a combination of dichlorosilane and ammonia. In other embodiments, the silicon nitride seasoning film may be formed from silane and nitrogen. In other embodiments, the seasoning film may be a silane $SiO_x$ film. The silane $SiO_x$ film may be formed from silane and oxygen.

The heterogeneous seasoning process continues until the seasoning film has the desired thickness. In some embodiments, the seasoning film has a thickness of at least about 5000 Å, such as at least about 10000 Å. In other embodiments, the seasoning film has a thickness of at least about 15000 Å. In other embodiments, the seasoning film has a thickness between greater than 5000 Å and about 30000 Å, such as between about 10000 Å and about 30000 Å. In other embodiments, the seasoning film has a thickness between about 10000 Å and about 25000 Å, such as between 15000 Å and 20000 Å. In embodiments wherein the seasoning film has a thickness of less than 5000 Å, the deposition rate of substrates processed in the chamber may exhibit a rate drift unsuitable for certain applications.

The endpoint for the heterogeneous seasoning process may be determined by using a preset time limit. For example, in embodiments where a silicon nitride seasoning film is formed using silane and ammonia, a seasoning film of approximately 15000 Å may be formed by allowing the process to continue for about ten minutes. Alternatively, or in addition, the endpoint for the heterogeneous seasoning process may be determined by measuring the seasoning film thickness on a substrate positioned within the processing chamber 102 and comparing the measured film thickness to the desired seasoning film thickness.

The heterogeneous seasoning process may be performed with or without a substrate 140 positioned inside the processing chamber 102. In some embodiments, the heterogeneous seasoning process is performed before the first deposition of a film on a substrate 140. In other embodiments, the heterogeneous seasoning process is performed after at least one deposition of a film on a substrate 140.

In some embodiments, only a single seasoning film is formed. For example, only a single heterogeneous seasoning film may be formed. In other embodiments, more than one seasoning film may be formed. For example, a heterogeneous seasoning film may be formed, and thereafter, one or more additional heterogeneous seasoning films or one or more homogeneous seasoning films may be formed thereon. In another embodiment, a homogeneous seasoning film may first be formed, and thereafter, one or more additional homogeneous seasoning films or one or more heterogeneous seasoning films may be formed thereon.

At optional block 206, a substrate 140 is positioned inside the processing chamber 102 and a film is deposited thereon. The substrate 140 may be positioned on the substrate support assembly 138. The deposited film may be, for example, a silane $SiO_x$ film, a TEOS $SiO_x$ film, another $SiO_x$ film, another silicon-containing film, or a non-silicon-containing film.

In embodiments wherein the deposited film is a TEOS $SiO_x$ film, the TEOS $SiO_x$ film may be deposited using the following representative conditions. TEOS may be flowed from the supply sources 104 to the entry port 180 and then into the process volume 112. TEOS may be flowed into the processing chamber 102 at a flow rate between about 360 sccm/substrate $m^2$ and about 720 sccm/substrate $m^2$, such as about 540 sccm/substrate $m^2$. Oxygen may be similarly flowed into the processing chamber 102 at a flow rate between about 9000 sccm/substrate $m^2$ and about 13000 sccm/substrate $m^2$, such as about 11000 sccm/substrate $m^2$. In some embodiments, an inert gas, such as nitrogen or argon, may also be similarly flowed into the processing chamber 102.

In depositing the TEOS $SiO_x$ film, the pressure of the processing chamber 102 may between about 800 mTorr and about 1200 mTorr, such as about 1000 mTorr. The spacing between the substrate 140 and lower surface 120 of the gas distribution plate assembly 118 may be between about 400 mil and about 800 mil, such as between about 500 mil and about 700 mil, such as about 600 mil. The substrate support assembly 138 may be heated to a temperature between about 300° C. and about 400° C., such as between about 360° C. and about 380° C.

A plasma may be generated in the processing chamber 102 to assist in depositing the $SiO_x$ film. The plasma power source 122 may ignite a plasma from the TEOS and oxygen gases by applying to the gas distribution plate assembly 118 an RF power per substrate surface area of between about 1400 W/m² and about 2200 W/m², such as between about 1600 W/m² and about 1900 W/m², such as about 1800 W/m².

SiO$_x$ films deposited according to the methods disclosed herein may be used in many commercial applications. For example, the SiO$_x$ films may be used as an oxide gate insulator in a TFT, an oxide gate insulator in an organic light emitting diode (OLED) device, an oxide etch stopper in a metal oxide TFT, or an oxide buffer layer in an OLED device.

At optional block 208, the substrate 140 is removed from the processing chamber 102. In some embodiments, a second substrate 140 is then positioned in the processing chamber 102, such as on the substrate support assembly 138. A film, such as a SiO$_x$ film, may then be deposited on the second substrate 140. In some embodiments, the substrate positioning, film deposition, and substrate removal cycle is repeated until the cleaning cycle is complete. The cleaning cycle may include, for example, 6 or 8 substrates 140. In other embodiments, the cleaning cycle may include fewer than 6 substrates 140. In still other embodiments, the cleaning cycle may include more than 8 substrates 140. At optional block 210, blocks 202-208 are repeated.

The previously described embodiments have many advantages, including the following. Embodiments disclosed herein, which do not require hardware or software retrofitting, can be easily integrated into a wide variety of process flows and do not affect the processing conditions of the upstream or downstream processes. For example, most flat panel display or AMOLED fabrication facilities contain sources of silane, TEOS, nitrogen, and ammonia gases, so additional plumbing would be unnecessary. Additionally, the disclosed heterogeneous seasoning process may not cause any significant particle contamination or particle accumulation. Furthermore, as compared to a homogeneous seasoning process, the heterogeneous seasoning process does not affect the film properties. The absence of an effect is unexpected because heterogeneous seasoning processes often adversely affect film properties. For example, heterogeneous seasoning processes frequently cause contamination of the films deposited within the cleaning cycle. The absence of an effect in the disclosed seasoning process is observed even when no homogeneous seasoning film is formed on top of the heterogeneous seasoning film.

Embodiments disclosed herein also effectively and efficiently stabilize the deposition rate of TEOS SiO$_x$, both in general and compared to the homogeneous TEOS SiO$_x$ seasoning process. The heterogeneous seasoning process using a silicon nitride seasoning film can stabilize the subsequent TEOS SiO$_x$ deposition after only 10 minutes. After a 10 minute heterogeneous seasoning process, a silicon nitride seasoning film formed from silane and ammonia has a thickness of about 15000 Å and results in a TEOS SiO$_x$ deposition rate that drifts only about 2%. The homogeneous seasoning process (seasoning with TEOS SiO$_x$ when depositing TEOS SiO$_x$ films during the cleaning cycle) demonstrates a rate drift that is twice as high after more than 18 minutes. Thus the heterogeneous seasoning process demonstrates significantly improved deposition rate stabilization in 40% less time. As a result, embodiments disclosed herein improve substrate throughput from 34 substrates per hour (with homogenous seasoning) to 38 substrates per hour. Additionally, despite using high power to generate a plasma, the silicon nitride heterogeneous seasoning process can be carried out without arcing. The aforementioned advantages are illustrative and not limiting. It is not necessary for all embodiments to have all the advantages.

While the foregoing is directed to embodiments of the present invention, other and further embodiments of the invention may be devised without departing from the basic scope thereof, and the scope thereof is determined by the claims that follow.

What is claimed is:

1. A method of depositing a silicon oxide film, the method comprising:
    cleaning a processing chamber;
    heterogeneously seasoning the processing chamber with a first material by forming a silicon nitride film on at least one chamber component exposed to deposition precursors, wherein the heterogeneously seasoning further comprises flowing silane and ammonia into the processing chamber;
    positioning a substrate in the processing chamber; and
    depositing a silicon oxide film on the substrate by flowing tetraethyl orthosilicate into the processing chamber.

2. The method of claim 1, wherein the heterogeneously seasoning further comprises igniting the silane and the ammonia into a plasma.

3. The method of claim 2, wherein the heterogeneously seasoning further comprises flowing nitrogen into the processing chamber, and wherein the flow rate ratio of silane to nitrogen is between about 1:5 and about 1:15.

4. The method of claim 2, wherein the flow rate ratio of silane to ammonia is between about 1:2 and about 1:6.

5. The method of claim 2, wherein the processing chamber pressure is between about 1000 mTorr and about 2000 mTorr.

6. The method of claim 2, wherein the plasma is generated from an RF power between about 1400 W/m² and about 2200 W/m².

7. The method of claim 2, wherein the silicon nitride film has a thickness of at least about 10,000 Å.

8. The method of claim 2, wherein the silicon nitride film has a thickness between about 10,000 Å and about 20,000 Å.

9. The method of claim 2, wherein the heterogeneously seasoning further comprises flowing nitrogen into the processing chamber, and wherein:
    the flow rate ratio of silane to nitrogen is between about 1:5 about 1:15;
    the flow rate ratio of silane to ammonia is between about 1:2 and about 1:6;
    the processing chamber pressure is between about 1000 mTorr and about 2000 mTorr;
    the plasma is generated from a RF power between about 1400 W/m² and about 2200 W/m²; and
    the heterogeneously seasoning is carried out for at least ten minutes.

10. The method of claim 2, wherein the heterogeneously seasoning is performed without a substrate in the processing chamber.

11. The method of claim 2, wherein the silicon oxide film forms an oxide gate insulator in a thin film transistor, an oxide gate insulator in an organic light emitting diode device, an oxide etch stopper in a metal oxide thin film transistor, or an oxide buffer layer in an organic light emitting diode device.

12. The method of claim 2, further comprising:
    removing the substrate from the processing chamber;
    positioning a second substrate in the processing chamber; and
    depositing a silicon oxide film on the second substrate.

13. The method of claim 1, wherein the heterogeneously seasoning forms a film of a thickness of at least about 10000 Å on at least one chamber component exposed to deposition precursors.

14. A method of depositing a film, the method comprising:
cleaning a processing chamber;
heterogeneously seasoning the processing chamber with a first material by forming a silicon nitride film on at least one chamber component exposed to deposition precursors, wherein heterogeneously seasoning comprises forming a seasoning film having a thickness of at least about 10000 Å;
positioning a substrate in the processing chamber; and
depositing a film comprising a second material that is different from the first material on the substrate, wherein the heterogeneously seasoning further comprises flowing silane and ammonia into the processing chamber.

15. The method of claim 14, further comprising:
removing the substrate from the processing chamber;
positioning a second substrate in the processing chamber; and
depositing a film comprising a second material that is different from the first material on the second substrate.

16. A method of depositing a silicon oxide film, the method comprising:
cleaning a processing chamber;
forming a silicon nitride seasoning film on at least one chamber component exposed to deposition precursors, wherein forming the silicon nitride seasoning film comprises:
   flowing silane, ammonia, and nitrogen into the processing chamber,
   igniting the silane and ammonia into a plasma, wherein the plasma is ignited from an RF power of between about 1400 W/m$^2$ and about 2200 W/m$^2$; and
   wherein the processing chamber pressure is between about 1000 mTorr and about 2000 mTorr;
   wherein the silicon nitride seasoning film has a thickness of at least about 10000 Å;
   wherein the flow rate ratio of silane to ammonia is between about 1:2 and about 1:6; and
   wherein the flow rate ratio of silane to nitrogen is between about 1:5 about 1:15;
positioning a substrate in the processing chamber; and
depositing a silicon oxide film on the substrate, wherein the depositing the silicon oxide film comprises flowing tetraethyl orthosilicate into the processing chamber.

17. The method of claim 16, further comprising:
removing the substrate from the processing chamber;
positioning a second substrate in the processing chamber; and
depositing a silicon oxide film on the second substrate.

* * * * *